US010172251B2

(12) United States Patent
Lee et al.

(10) Patent No.: US 10,172,251 B2
(45) Date of Patent: Jan. 1, 2019

(54) FASTENING STRUCTURE, ELECTRONIC ASSEMBLY AND OPERATING METHOD OF FASTENING STRUCTURE

(71) Applicant: Wistron Corporation, New Taipei (TW)

(72) Inventors: Tung-Ping Lee, New Taipei (TW); Yu-Ling Kuo, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/632,400

(22) Filed: Jun. 26, 2017

(65) Prior Publication Data
US 2018/0235100 A1 Aug. 16, 2018

(30) Foreign Application Priority Data
Feb. 15, 2017 (TW) .............................. 106104954 A

(51) Int. Cl.
*H01R 13/64* (2006.01)
*H05K 7/14* (2006.01)
(Continued)

(52) U.S. Cl.
CPC ............ *H05K 7/1474* (2013.01); *G06F 1/183* (2013.01); *G06F 1/187* (2013.01); *G11B 33/00* (2013.01);
(Continued)

(58) Field of Classification Search
CPC ............ H01R 23/7042; H01R 23/7005; H01R 13/73; H05K 7/1474; H05K 7/1408; H05K 7/1417; G06F 1/183; G06F 1/187
(Continued)

(56) References Cited

U.S. PATENT DOCUMENTS

| 7,491,070 B2 | 2/2009 | Chen et al. | |
| 7,833,025 B2 * | 11/2010 | Voli et al. | H01R 12/00 439/573 |

(Continued)

FOREIGN PATENT DOCUMENTS

| TW | M295762 | 8/2006 |
| TW | M495441 | 2/2015 |

OTHER PUBLICATIONS

"Office Action of Taiwan Counterpart Application" with partial English translation, dated May 8, 2017, p. 1-4.

*Primary Examiner* — Khiem Nguyen
(74) *Attorney, Agent, or Firm* — JCIPRNET

(57) ABSTRACT

A fastening structure including a base pillar, a pair of elastic arms, and a top pillar is provided. The base pillar is assembled to an object, the elastic arms are connected between the top and the base pillars, and a gap is provided between the elastic arms. The top pillar is adapted to stretch or compress the elastic arms when an external force is exerted to reduce or expand the gap. The top pillar and the elastic arms pass through a through hole of a connector when the elastic arms are stretched to reduce the gap to make the connector contact the base pillar. After the force is removed, the gap between the elastic arms is restored to fasten the fastening structure between the elastic arms and the base pillar in a floating state. An electronic assembly and an operating method of the fastening structure are also provided.

19 Claims, 7 Drawing Sheets

(51) Int. Cl.
*G06F 1/18* (2006.01)
*G11B 33/00* (2006.01)

(52) U.S. Cl.
CPC ......... *H05K 7/1408* (2013.01); *H05K 7/1417* (2013.01)

(58) Field of Classification Search
USPC .................. 439/377, 567, 569, 573, 953
See application file for complete search history.

(56) References Cited

U.S. PATENT DOCUMENTS

| | | | |
|---|---|---|---|
| 8,231,405 B2 * | 7/2012 | Hsieh et al. ........... | H01R 13/73 439/76.1 |
| 8,241,059 B2 * | 8/2012 | Huang ................. | H01R 13/621 439/574 |

* cited by examiner

FASTENING STRUCTURE, ELECTRONIC ASSEMBLY AND OPERATING METHOD OF FASTENING STRUCTURE

CROSS-REFERENCE TO RELATED APPLICATION

This application claims the priority benefit of Taiwan application serial no. 106104954, filed on Feb. 15, 2017. The entirety of the above-mentioned patent application is hereby incorporated by reference herein and made a part of this specification.

BACKGROUND OF THE INVENTION

1. Field of the Invention

The present disclosure relates to a fastening structure, an electronic assembly, and an operating method of the fastening structure.

2. Description of Related Art

In the conventional info nation devices, such as severs, industrial computers, disk array storage devices, external disk drive cases, network attached storage (NAS) devices, and the like, an array-type disk swap module is commonly adopted as the storage device. Normally, a disk and other components are fixed in a case by screw-locking. Namely, screws are respectively aligned to and screwed into screw holes. Such process may take a certain amount of time, and the time required to turn off the device for maintenance may thus increase significantly. If the case is a server case, the frame is thin, and the height between levels in the frame is short, so no matter a computer or a server is installed, the case may be filled with various components, such as interface cards, hard drives, and power wires, and may cause difficulties on screw-locking. Sometimes the screws may even be detached during screw-locking and the screws may be lost.

Besides, after the storage device and a connector of the system are connected and screw-locked, the screw-locked part may become the stress concentration part in the structure. Thus, the operation of the storage device or the vibration caused by maintenance or movement may result in structural damage at the stress concentration part, and the connector may consequently be damaged.

SUMMARY OF THE INVENTION

The present disclosure provides a fastening structure, an electronic assembly, and an operating method of the fastening structure capable of quickly switching a connector between various states of use with a simple fastening structure.

A fastening structure according to an embodiment of the present disclosure is configured to detachably assemble a connector to an object. The fastening structure includes a base pillar, a top pillar, and a pair of elastic arms. The base pillar is assembled to the object. The pair of elastic arms is respectively connected between the base pillar and the top pillar, and a gap is provided between the elastic arms. The top pillar is adapted to stretch or compress the elastic arms when an external force is exerted, so as to reduce or expand the gap. When the elastic arms are stretched and the gap is reduced, the top pillar and the elastic arms are adapted to pass through a through hole of the connector to make the connector contact the base pillar. After the external force is removed, the gap between the elastic anus is restored by an elastic force to fasten the connector between the elastic arms and the base pillar in a floating state.

An electronic assembly according to an embodiment of the present disclosure includes a carrier plate, a storage device, a fastening structure, and a second connector. The storage device is assembled onto the carrier plate and has a first connector. The fastening structure has a base pillar, a pair of elastic arms, and a top pillar. The base pillar is assembled onto the carrier plate, the elastic arms are respectively connected between the base pillar and the top pillar, and a gap is provided between the elastic arms. The second connector is fastened to the carrier plate in a floating state by the fastening structure. The top pillar is adapted to compress the elastic arms by an external force and expand the gap. When the gap is expanded, the second connector abuts between the elastic arms and the base pillar in a fixed state to assemble the first connector to the second connector in the fixed state.

An operating method of a fastening structure according to an embodiment of the present disclosure is configured to connect a first connector of a storage device and a second connector disposed on a carrier plate. The fastening structure includes a base pillar, a top pillar, and a pair of elastic arms respectively connected between the base pillar and the top pillar, and a gap is provided between the pair of elastic arms. The operating method of the fastening structure includes: assembling the fastening structure to the carrier plate to arrange the base pillar, the elastic arms and the top pillar to stand on the carrier plate in a direction away from the carrier plate; assembling the second connector to the fastening structure to come to a floating state between the second connector and the fastening structure; providing an external force to the top pillar to compress the elastic arms and expand the gap, so as to convert the fastening structure from the floating state to a fixed state; connecting the first connector and the second connector in the fixed state; and canceling the fixed state to restore the floating state of the fastening structure by an elastic force of the elastic arms.

Based on the above, with a simple structural design and elastic property of the fastening structure, the user may quickly and easily assemble the connector to an object (e.g., the carrier plate) without an additional locking component. Thus, the manufacturing cost and time required are reduced effectively. Moreover, the user may easily exert a force to deform the elastic arms of the fastening structure because of the structural feature and the elastic property of the gap. When the elastic arms are stretched and the gap is reduced, the fastening structure is adapted to be assembled with the connector. When the elastic arms are compressed and the gap is expanded, the fastening structure is adapted to be fixed onto the carrier plate and connected with the storage device. In addition, after the connection, the gap of the elastic arms is restored to the original gap due to an elastic restoring force of the elastic arms. Therefore, the floating state between the connector and the fastening structure is restored to allow synchronous movement with the storage device. Hence, the accumulation of stress caused by the connector being fixed to the carrier plate is avoided, and the lifetime of the connector is increased.

In order to make the aforementioned and other features and advantages of the present disclosure comprehensible, several exemplary embodiments accompanied with figures are described in detail below.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
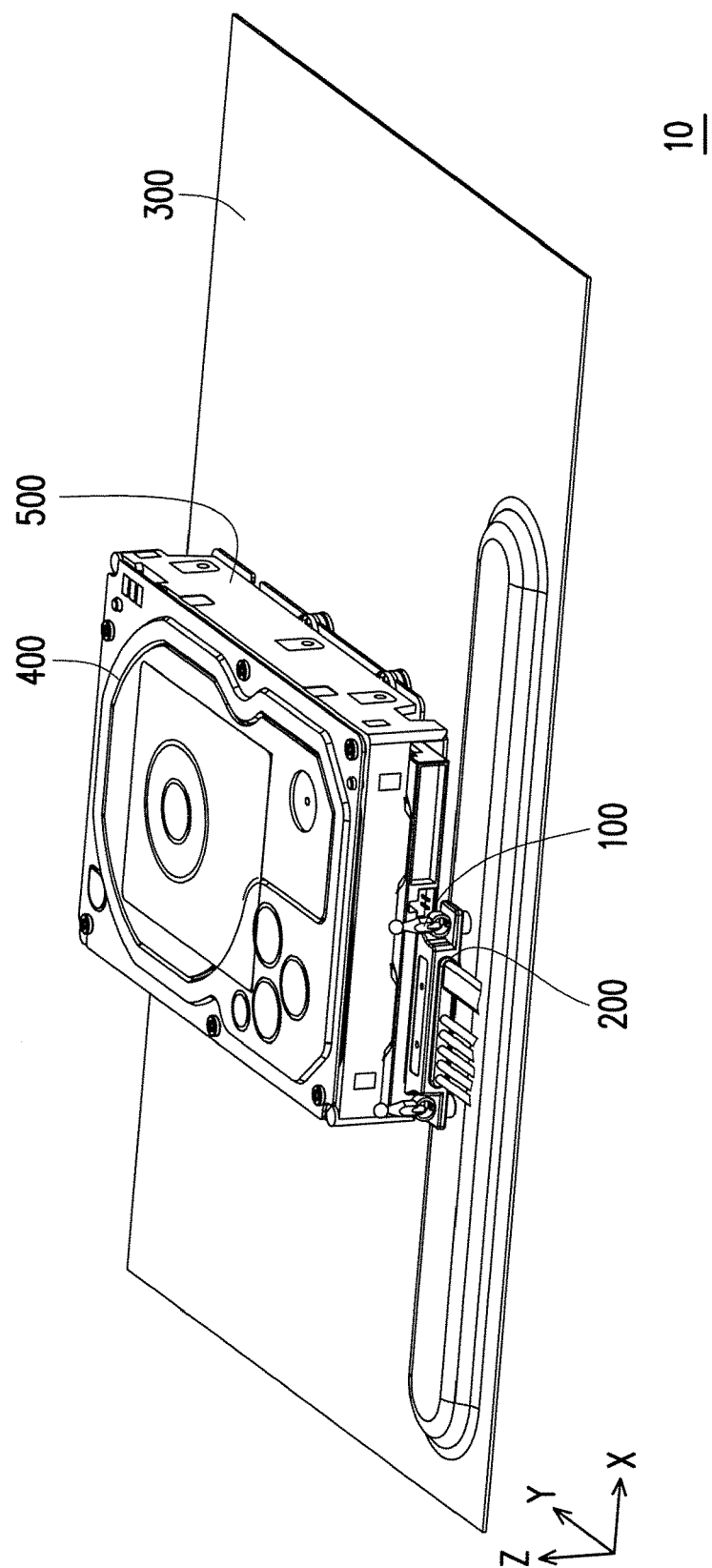
FIG. 1 is a schematic view illustrating an electronic assembly according to an embodiment of the present disclosure.

Reference will now be made in detail to the present preferred embodiments of the present disclosure, examples of which are illustrated in the accompanying drawings. Wherever possible, the same reference numbers are used in the drawings and the description to refer to the same or like parts.

Figure 2:
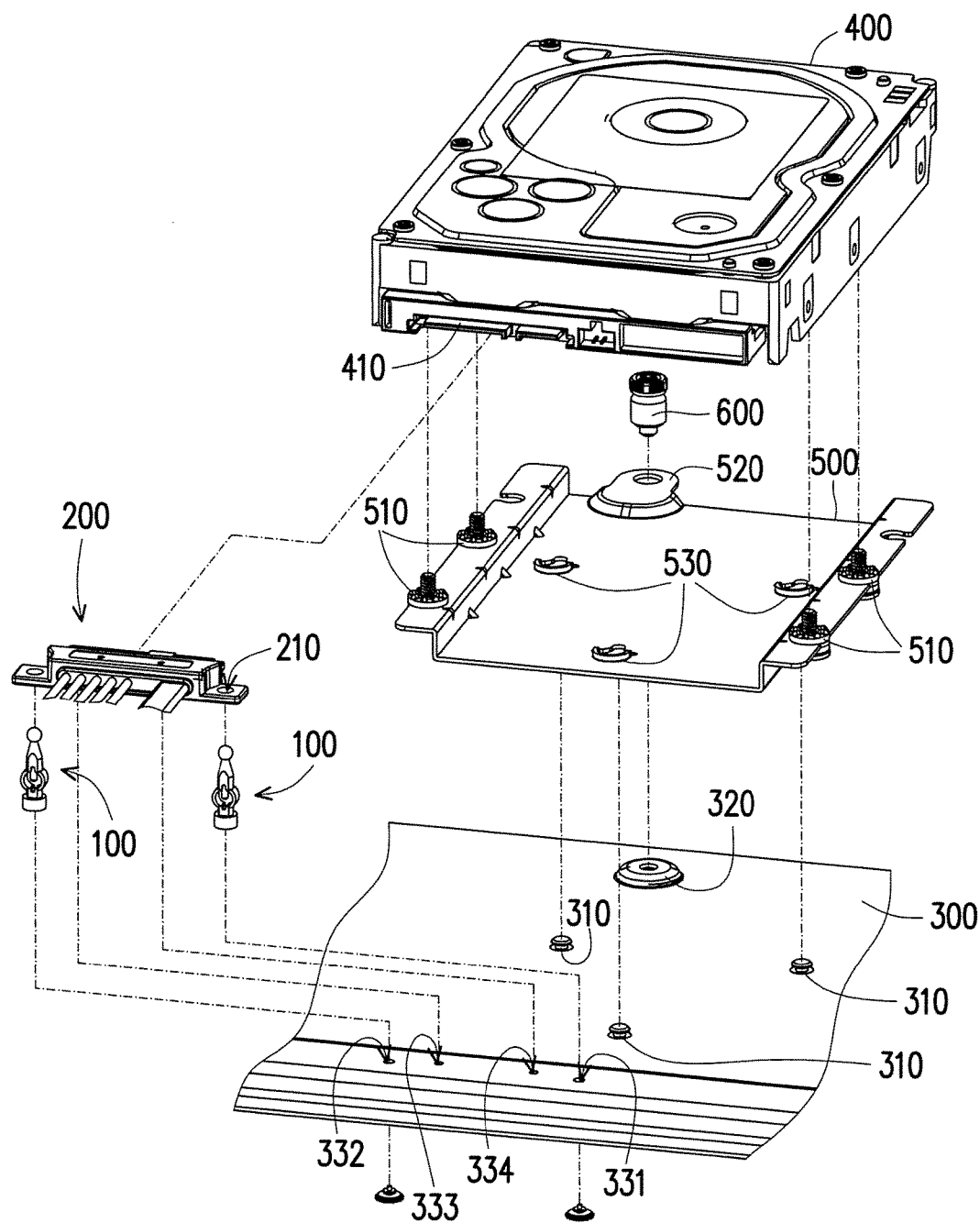
FIG. 2 is an exploded view illustrating the electronic assembly of FIG. 1.

FIG. 1 is a schematic view illustrating an electronic assembly according to an embodiment of the present disclosure. FIG. 2 is an exploded view illustrating the electronic assembly of FIG. 1. Here, a Cartesian coordinate (X-Y-Z) system is provided herein for the ease of descriptions. Referring to FIGS. 1 and 2, in the embodiment, an electronic assembly 10 is a part of a structure of a server system. The electronic assembly 10 includes a carrier plate 300, a storage device 400, a bracket 500, a fastening structure 100, and a first connector 200 (e.g., a cable connector). In addition, the carrier plate 300 is adapted to be disposed in a frame of the server in a layered arrangement to be pulled out of or moved into the frame. The storage device 400, (e.g., a hard drive) is detachably assembled onto the carrier plate 300 through the bracket 500. Here, no limitation is intended for the number of the storage device 400. In another embodiment, a plurality of storage devices may be disposed on the same bracket to form a disk array.

As shown in FIG. 1, the first connector 200 is drawn from a power source (not shown) of the server system to be connected to a second connector 410 of the storage device 400 for power supply. Here, no limitation is intended for the type of the first connector 200, either.

As shown in FIG. 2, for fast attachment and fast detachment of the storage device 400 onto the carrier plate 300, the storage device 400 is assembled to the bracket 500 in advance through a plurality of fixing pins 510 located on wing parts. Then, with a corresponding arrangement of movable fastening assemblies 310, 530 and a locking component 600 penetrating through a locking hole 520 of the bracket 500 to be fixed to a locking structure 320 on the carrier plate 300, the user is able to quickly and conveniently assemble/detach the storage device 400 alongside the bracket 500 to/from the carrier plate 300. In other words, when detaching the storage device 400 from the carrier plate 300, the user only needs to remove the locking component 600 and then move the bracket 500 to detach the bracket 500 together with the storage device 400 thereon.

Figure 3:
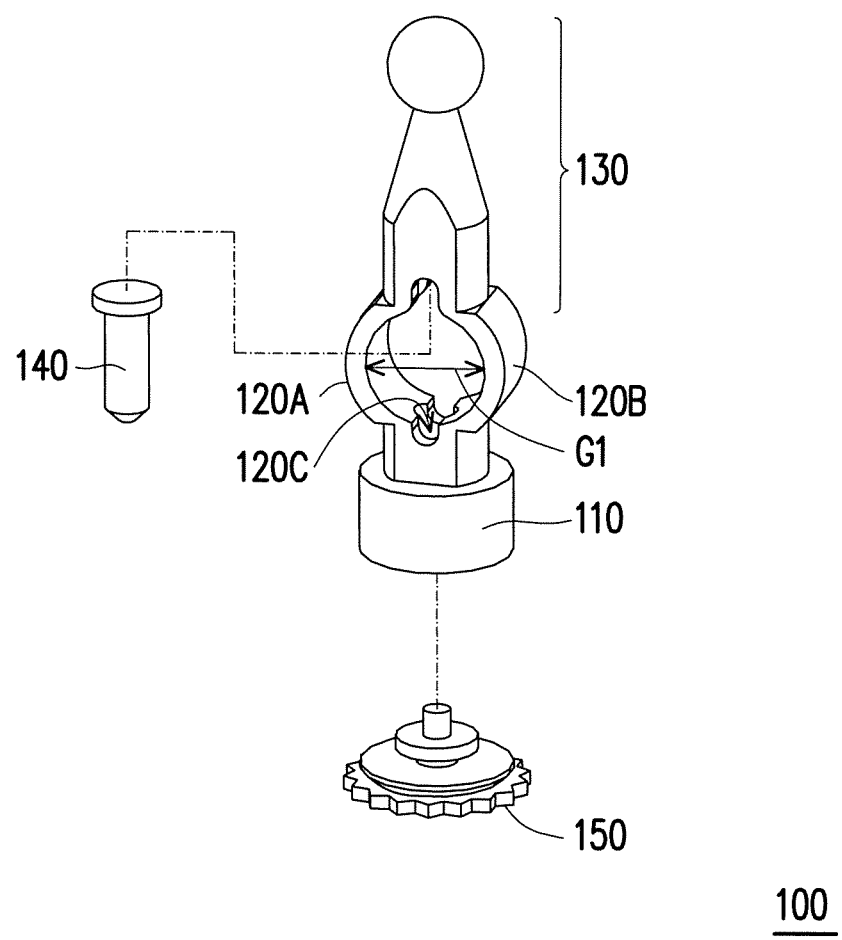
FIG. 3 is an exploded view illustrating a fastening structure of FIGS. 1 and 2.
Figure 4:
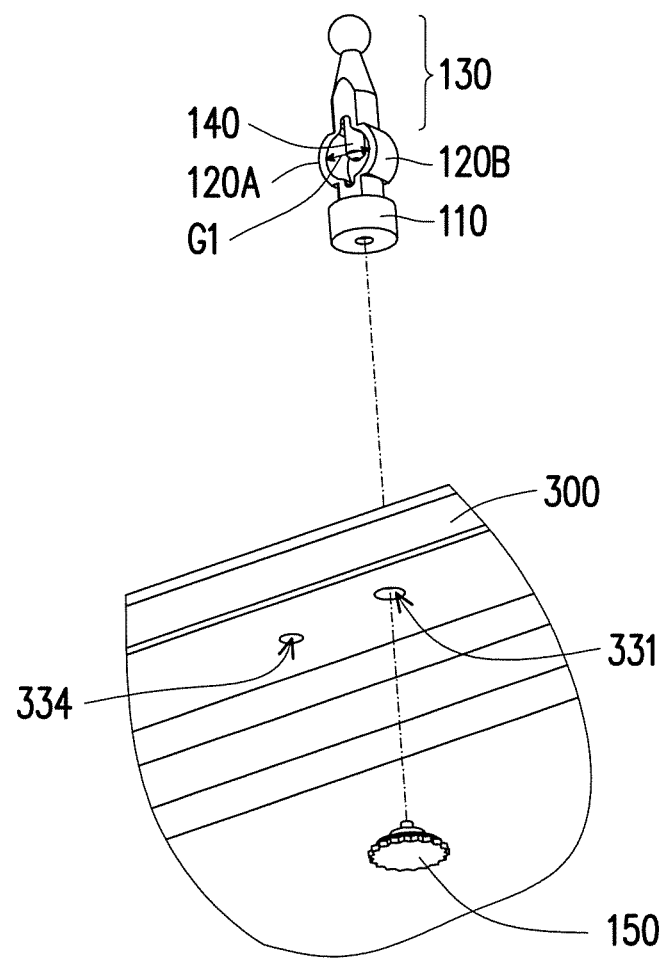
FIG. 4 is a schematic view illustrating assembling of the fastening structure and a carrier plate from another perspective.

FIG. 3 is an exploded view illustrating a fastening structure of FIGS. 1 and 2. FIG. 4 is a schematic view illustrating assembling of the fastening structure and a carrier plate from another perspective. Referring to FIGS. 2 to 4, in the embodiment, the fastening structure 100 includes a base pillar 110, elastic arms 120A, 120B, and a top pillar 130. The base pillar 110 is configured to be assembled to the carrier plate 300, the elastic arms 120A, 120B may extend from the base pillar 110, may be separated from each other, and then converge at and connect the top pillar 130. In other words, the elastic arms 120A and 120B are respectively connected between the base pillar 110 and the top pillar 130. A gap G1 is provided between the elastic arms 120A and 120B, as shown in FIGS. 3 and 4.

Specifically, the fastening structure 100 further includes a fixing base 150 and a fixing pillar 140. In addition, the fixing base 150 is a rigid component formed of a metal or plastic material, and is configured to pass through a bottom of the carrier plate 300 to be combined with the base pillar 110. Accordingly, the base pillar 110 may stand on a top of the carrier plate 300. Here, the top and the bottom refer to upper and lower surfaces of the carrier plate 300. It should be noted that the present disclosure does not intend to limit how the fixing base 150 is combined with the carrier plate 300 and the base pillar 110. The fixing base 150 may be combined with the carrier plate 300 and the base pillar 110 through riveting, screw-locking, or other common means of connection to achieve an effect as anticipated. In the embodiment, the fixing base 150 may be riveted to the carrier plate 300 in advance, and then combined with the base pillar 110.

Moreover, the base pillar 110, the elastic arms 120A, 120B, and the top pillar 130 are integrally formed of rubber or a common elastic material, for example. In addition, the fixing pillar 140 is embedded into the top pillar 130 and extends toward the direction of the fixing base 150 to be located at a position between the elastic arms 120A and 120B. Specifically, the fixing pillar 140 is combined with the fixing base 150 and the carrier plate 300 after the fixing pillar 140 is integrally formed with the base pillar 110, the elastic arms 120A, 120B, and the top pillar 130 through in-mold injection, for example. However, the present disclosure is not limited thereto. As shown in FIG. 1, since the elastic arms 120A and 120B are deformable, the base pillar 110 and the top pillar 130 are relatively movable along the Z-axis, and the fixing pillar 140 may move toward or away from the base pillar 110 with the top pillar 130 along the Z-axis.

In the embodiment, since the elastic arms 120A and 120B formed of an elastic material are separated from each other to provide the gap G1, the elastic arms 120A and 120B may be deformed when a force is exerted to the fastening structure 100. Here, the elastic arms 120A and 120B are in arc-shaped profiles with recessed parts opposite to each other, and the gap G1 is the longest distance between the arc-shaped profiles.

Figure 5:
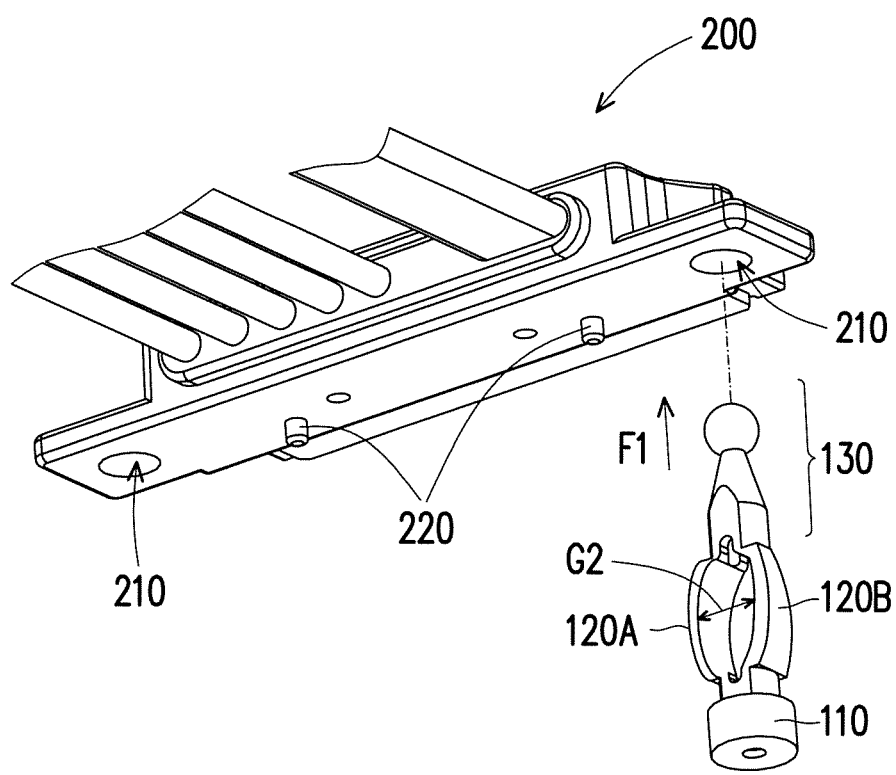
FIG. 5 is a schematic view illustrating assembling of a fastening structure and a connector.

FIG. 5 is a schematic view illustrating assembling of a fastening structure and a connector. Referring to FIGS. 2, 4, and 5, to pivot through holes 210 on sides of the connector to the fastening structure 100, the user needs to exert a first external force F1 to the top pillar 130 to stretch the elastic arms 120A and 120B, and thus reduce the gap between the elastic arms 120A and 120B (i.e., from the gap G1 shown in FIG. 4 to a gap G2 shown in FIG. 5). Under the circumstance, the top pillar 130 and the elastic arms 120A and 120B are able to pass through the through holes 210, and the first connector 200 is thus able to contact the base pillar 110 at structures where the through holes 210 are located. After the user releases the first external force F1, the elastic arms 120A and 120B may restore to an original state due to an elastic force thereof. In other words, the gap G1 is restored. Therefore, the first connector 200 may be retained between the elastic anus 120A, 120B and the base pillar 110 of the fastening structure 100. Since the base pillar 110 and the elastic arms 120A and 120B are fainted of an elastic material, the first connector 200 and the fastening structure 100 are fastened in a floating state.

The fastening in the floating state indicates that the components (e.g. the carrier plate 300 and the first connector 200) are position-limited with respect to each other but not fixed. Namely, the components remain possibility of relatively moving in the combined structure. Being relatively moving refers to that there remains to be flexible for movement between the first connector 200 and the fastening structure 100 when a force is applied due to properties of the elastic arms 120A and 120B. Therefore, there is no stress concentration between the first connector 200 and the fastening structure 100 caused by fixing therebetween. Moreover, the top pillar 130 exhibits a shrinking profile in a direction away from the carrier plate 300 relative to the elastic arms 120A and 120B or the base pillar 110. Hence, the user is able to hold the top pillar 130 by hand to stretch or compress the elastic anus 120A and 120B. Referring to FIGS. 2 and 5, positioning pillars 220 pass through positioning holes 333 and 334 of the carrier plate 300, and then the fastening structure 100 passes through positioning hole 331 and 332, so as to position the first connector 200 onto the carrier plate 300.

Based on the above, with a simple structural design and elastic property of the fastening structure 100, the user may quickly and easily assemble the first connector 200 to an object (e.g., the carrier plate 300 in the embodiment, but the present disclosure is not limited thereto). Thus, the assembling does not require screw-locking, and the cost of components and time required for assembling/detaching are consequently reduced effectively.

Figure 6:
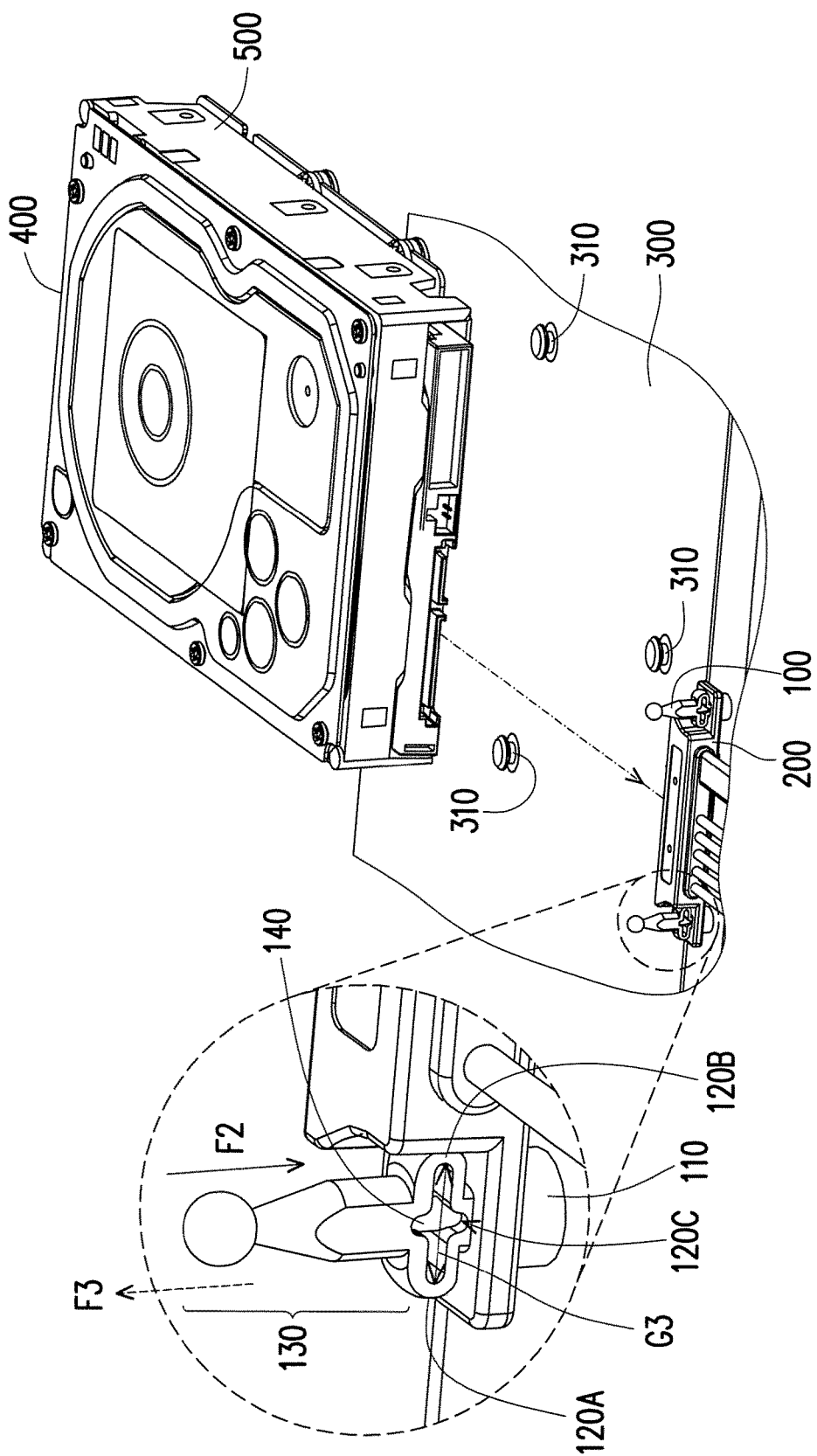
FIG. 6 is a schematic view illustrating assembling of a storage device and a fastening structure.
Figure 7:
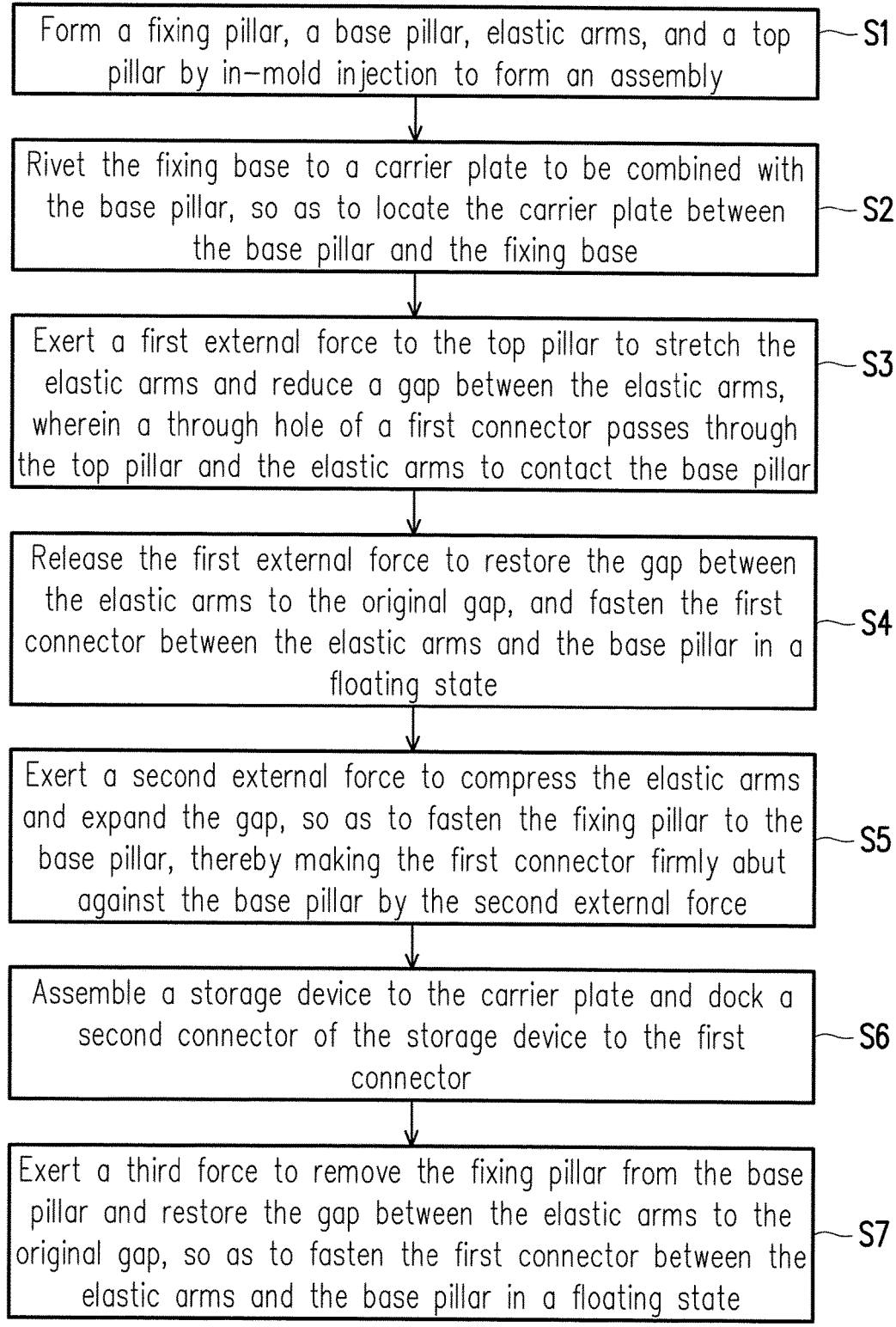
FIG. 7 is a schematic view illustrating an operating method of a fastening structure according to an embodiment of the present disclosure.

FIG. 6 is a schematic view illustrating assembling of a storage device and a fastening structure. FIG. 7 is a schematic view illustrating an operating method of a fastening structure according to an embodiment of the present disclosure. Referring to FIG. 7 combined with FIGS. 6, 2 and 5, in the embodiment, the base pillar 110, the elastic arms 120A and 120B, the top pillar 130, and the fixing pillar 140 of the fastening structure 100 are injection-molded together in Steps S1 and S2 by in-mold injection. Then, the fixing base 150 is riveted to the carrier plate 300 and a portion of the fixing base 150 passes through the carrier plate 300 to be combined with the base pillar 110. Accordingly, the carrier plate 300 is located between the fixing base 150 and the base pillar 110, and the fastening structure 100 thus stands on the carrier plate 300. Then, in Step S3, as shown in FIG. 5, the first external force F1 is exerted to the top pillar 130 to stretch the elastic arms 120A and 120B. Accordingly, the gap G1 is reduced to the gap G2 to allow the through holes 210 of the first connector 200 to be pivoted through and to allow the top pillar 130 to pass through the through holes 210 and the elastic arms 120A and 120B, and then contact the base pillar 110. In Step S4, when the first external force F1 is released, the original gap G1 between the elastic arms 120A and 120B is restored due to elasticity. Therefore, the first connector 200 is fastened between the elastic arms 120A and 120B and the base pillar 110 in the floating state.

Then, referring to FIG. 6, in Step S5, since the first connector 200 is fastened to the fastening structure 100 in the floating state, to smoothly connect the second connector 410 of the storage device 400 to the first connector 200, the user needs to exert a second external force F2 to the top pillar 130 of the fastening structure 100 to compress the elastic arms 120A and 120B to thereby increase the gap from the original gap G1 to a gap G3. Meanwhile, the fixing pillar 140 may also be correspondingly engaged to an engagement hole 120C (shown in FIG. 3) on the base pillar 110 as the top pillar 130 moves toward the base pillar 110. Hence, the first connector 200 firmly abuts against the base pillar 110 by the second external force F2, and is thus converted from the floating state to a fixed state. Under the circumstance, the first connector 110 is engaged between the base pillar 110 and the elastic arms 120A and 120B, and the elastic arms 120A and 120B are temporarily not elastic as the elastic arms 120A and 120B are compressed and deformed. Meanwhile, since an interfering force between the fixing pillar 140 and the engagement hole 120C is greater than the elastic force of the elastic arms 120A and 120B, after the user removes the second external force F2, the elastic arms 120A and 120B may remain in the fixed state shown in FIG. 6.

Accordingly, the user may combine the storage device 400 and the carrier plate 300 in Step S6, and the first connector 200 and the second connector 410 may be docked to each other to complete the assembling.

Lastly, in Step S7, a third external force F3 is exerted to remove the fixing pillar 140 from the engagement hole 210 of the base pillar. Under the circumstance, the gap between the elastic arms 120A and 120B may be restored from the gap G3 to the gap G1 through the elastic force, and the floating state between the first connector 200 and the fastening structure 100 is also restored. Thus, even if the storage device 400 is operated and generates vibration, the first connector 200 is substantially synchronized with the storage device 400 (i.e., vibrate with the storage device 400). Therefore, the stress does not accumulate at the structure to damage the first connector 200.

In view of the above, with a simple structure and elastic property of the elastic arms, the elastic arms of the fastening structure may be forced to be stretched or compressed to reduce or expand the gap between the elastic arms. Thus, the first connector is consequently able to be quickly and conveniently combined with the fastening structure to stand on the carrier plate in a floating state. Moreover, when the second connector of the storage device is to be connected with the first connector and the storage device is to be assembled to the carrier plate, the user only needs to compress the elastic arms to expand the gap between the elastic arms and thus combine the fixing pillar to the engagement hole of the base pillar. Hence, the first connector may be converted from the floating state to a fixed state for facilitating docking of the first connector and the second connector. Lastly, the user removes the fixing pillar from the engagement hole to restore the original gap between the elastic arms due to elasticity. Accordingly, the fastening structure may return to the floating state again.

Accordingly, through simply switching the fastening structure between different states, assembling the first connector to the carrier plate, assembling the storage device to the carrier plate to be docked to the first connector and maintaining the floating state between the first connector and the storage device after assembling are able to be achieved at the same time. For people having ordinary skills in the art, the fastening structure, the electronic assembly using the fastening structure, and the operating method of the fastening structure provide a convenient and efficient process and reduce the damage caused by accumulation of stress at the fixing structure between the connector and the storage device.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims and their equivalents.

What is claimed is:

1. A fastening structure, configured to detachably assemble a connector to an object, wherein the fastening structure comprises:
    a base pillar, assembled to the object;
    a top pillar; and
    a pair of elastic arms, respectively connected between the base pillar and the top pillar, wherein a gap is provided between the pair of elastic arms, the top pillar is adapted to stretch or to compress the pair of elastic arms when an external force is exerted, so as to reduce or to expand the gap, when the pair of elastic arms are stretched and the gap is reduced, the top pillar and the pair of elastic arms are adapted to pass through a through hole of the connector to make the connector contact the base pillar, and after the external force is removed, the gap between the pair of elastic arms is restored to fasten the connector between the pair of elastic arms and the base pillar in a floating state.

2. The fastening structure as claimed in claim 1, wherein the pair of elastic arms are in arc-shaped profiles with recessed parts opposite to each other, and the gap is a longest distance between the arc-shaped profiles.

3. The fastening structure as claimed in claim 1, further comprising:
    a fixing pillar, embedded in the top pillar and extending to a space between the pair of elastic arms, wherein the base pillar has an engagement hole corresponding to the fixing pillar, and when the pair of elastic arms are compressed and the gap is expanded, the fixing pillar is engaged to the engagement hole, and the gap of the elastic arms is maintained in an expanded state.

4. The fastening structure as claimed in claim 3, wherein the fixing pillar is disposed in the top pillar by in-mold injection.

5. The fastening structure as claimed in claim 3, wherein an interfering force between the fixing pillar and the engagement hole is greater than an elastic force of the pair of elastic alias.

6. The fastening structure as claimed in claim 1, further comprising:
    a fixing base, riveted to the object and passing through the object to assemble to the base pillar, so as to locate the object between the fixing base and the base pillar.

7. An electric assembly, comprising:
    a carrier plate;
    a storage device, assembled onto the carrier plate and having a first connector;
    a fastening structure, having a base pillar, a pair of elastic arms, and a top pillar, wherein the base pillar is assembled onto the carrier plate, the pair of elastic arms are respectively connected between the base pillar and the top pillar, and a gap is provided between the pair of elastic arms;
    a second connector, fastened to the carrier plate in a floating state by the fastening structure, wherein the top pillar is adapted to compress the pair of elastic arms by an external force and expand the gap, and when the gap is expanded, the second connector abuts between the pair of elastic arms and the base pillar in a fixed state to assemble the first connector to the second connector in the fixed state; and
    a fixing pillar, embedded in the top pillar and extending to a space between the pair of elastic arms, wherein the base pillar has an engagement hole corresponding to the fixing pillar, and when the pair of elastic arms are compressed and the gap is expanded, the fixing pillar is engaged to the engagement hole to form the fixed state.

8. The electronic assembly as claimed in claim 7, wherein an interfering force between the fixing pillar and the engagement hole is greater than an elastic force of the pair of elastic arms, and when the external force is released and the fixing pillar is removed from the engagement hole by another external force, the pair of elastic arms are restored to the floating state by the elastic force.

9. The electronic assembly as claimed in claim 7, wherein a friction force between the fixing pillar and the engagement hole is smaller than an elastic force of the pair of elastic arms, and when the external force is released, the elastic force of the pair of elastic arms drives the fixing pillar to be detached from the engagement hole, and the pair of elastic arms are restored to the floating state by the elastic force.

10. The electronic assembly as claimed in claim 7, wherein the fixing pillar is disposed in the top pillar by in-mold injection.

11. The electronic assembly as claimed in claim 7, further comprising:
    a fixing base, riveted to the object and passing through the carrier plate to assemble to the base pillar, so as to locate the carrier plate between the fixing base and the base pillar.

12. The electronic assembly as claimed in claim 7, wherein the pair of elastic arms is in arc-shaped profiles with recessed parts opposite to each other, and the gap is a longest distance between the arc-shaped profiles.

13. An operating method of fastening structures, configured to connect a first connector of a storage device and a second connector disposed on a carrier plate, wherein the fastening structure comprises a base pillar, a top pillar, and a pair of elastic arms respectively connected between the base pillar and the top pillar, and a gap is provided between the pair of elastic arms, the operating method comprising:
    assembling the fastening structure to the carrier plate to arrange the base pillar, the pair of elastic arms and the top pillar to stand on the carrier plate in a direction away from the carrier plate;
    assembling the second connector to the fastening structure to form a floating state between the second connector and the fastening structure;
    providing an external force to the top pillar to compress the pair of elastic arms and expand the gap, so as to convert the fastening structure from the floating state to a fixed state;
    connecting the first connector and the second connector in the fixed state; and
    canceling the fixed state to restore the floating state of the fastening structure by an elastic force of the pair of elastic arms.

14. The operating method of the fastening structures as claimed in claim 13, wherein the fastening structure further comprises a fixing pillar embedded in the top pillar and extending to a space between the pair of elastic arms, the base pillar has an engagement hole corresponding to the fixing pillar, the external force is exerted to the top pillar to compress the pair of elastic arms and engage the fixing pillar to the engagement hole, so as to form the fixed state.

15. The operating method of the fastening structures as claimed in claim 14, wherein the fixing pillar, the pair of elastic arms and the base pillar are formed together by in-mold injection.

16. The operating method of the fastening structures as claimed in claim 14, further comprising:
providing another external force to the top pillar to remove the fixing pillar from the engagement hole and cancel the fixed state.

17. The operating method of the fastening structures as claimed in claim 14, wherein an elastic force between the pair of elastic arms is greater than an interfering force of the fixing pillar and the engagement hole, and the method further comprises:
removing the external force to drive the fixing pillar to be detached from the fixing hole and to cancel the fixed state by the elastic force of the pair of elastic arms.

18. The operating method of the fastening structures as claimed in claim 13, wherein the fastening structure further comprises a fixing base, and assembling the fastening structure to the carrier plate comprises:
riveting the fixing base to the carrier plate and assembling the fixing base to the fastening structure, so as to locate the carrier plate between the base pillar and the fixing base.

19. The operating method of the fastening structures as claimed in claim 13, wherein assembling the second connector to the fastening structure comprises:
providing another external force to the top pillar to stretch the pair of elastic arms and compress the gap;
passing the top pillar and the pair of elastic arms through a through hole of the second connector and the second connector is contacted with the base pillar; and
releasing the another external force to restore the gap of the pair of elastic arms and fasten the second connector between the pair of elastic arms and the base pillar in the floating state.

* * * * *